United States Patent
Abe et al.

(10) Patent No.: US 7,456,767 B2
(45) Date of Patent: Nov. 25, 2008

(54) D/A CONVERTER CIRCUIT, ORGANIC EL DRIVE CIRCUIT, AND ORGANIC EL DISPLAY

(75) Inventors: Shinichi Abe, Kyoto (JP); Jun Maede, Kyoto (JP); Masanori Fujisawa, Kyoto (JP); Akio Fujikawa, Kyoto (JP)

(73) Assignee: Rohm Co., Ltd., Tokyo (JP)

( * ) Notice: Subject to any disclaimer, the term of this patent is extended or adjusted under 35 U.S.C. 154(b) by 85 days.

(21) Appl. No.: 10/594,703

(22) PCT Filed: Mar. 28, 2005

(86) PCT No.: PCT/JP2005/005673
§ 371 (c)(1),
(2), (4) Date: Sep. 28, 2006

(87) PCT Pub. No.: WO2005/093958
PCT Pub. Date: Oct. 6, 2005

(65) Prior Publication Data
US 2007/0273566 A1 Nov. 29, 2007

(30) Foreign Application Priority Data
Mar. 29, 2004 (JP) ............................. 2004-095005

(51) Int. Cl.
*H03M 1/00* (2006.01)

(52) U.S. Cl. ...................... 341/135; 341/144; 341/145

(58) Field of Classification Search ................. 341/135, 341/144, 145; 345/89; 348/572; 315/169.1
See application file for complete search history.

(56) References Cited

U.S. PATENT DOCUMENTS

| | | | |
|---|---|---|---|
| 6,480,178 B1 * | 11/2002 | Itakura et al. | 345/89 |
| 6,654,066 B1 * | 11/2003 | Vu et al. | 348/572 |
| 2003/0184236 A1 * | 10/2003 | Maede et al. | 315/169.1 |

FOREIGN PATENT DOCUMENTS

| | | | |
|---|---|---|---|
| EP | 0541163 | * | 5/1993 |
| JP | 55-034537 | | 3/1980 |
| JP | 11251912 | * | 5/1999 |
| JP | 2003-234655 | | 8/2003 |

* cited by examiner

*Primary Examiner*—Jean B Jeanglaude
(74) *Attorney, Agent, or Firm*—Mattingly, Stanger, Malur & Brundidge, PC

(57) ABSTRACT

A D/A converter circuit includes a first current mirror circuit and a second current mirror circuit. The first current mirror circuit has a plurality of output side transistors provided correspondingly to digits of data to be converted and generates en analog current by obtaining, in at least one of the output side transistors, a current corresponding to the weight of the digit of the data being converted. The second current mirror circuit is connected on an upstream or downstream side of the output side transistors and corresponding to a lower digit of the data. An analog current is generated with the second current mirror circuit by obtaining a current corresponding to a weight of a digit that is less than 1.

12 Claims, 3 Drawing Sheets

D/A CONVERTER CIRCUIT, ORGANIC EL DRIVE CIRCUIT, AND ORGANIC EL DISPLAY

CROSS-REFERENCE RELATED APPLICATIONS

This application is a 371 of PCT/JP05/05673 filed Mar. 28, 2005 which claims priority to Japanese application No. 2004-095005 filed Mar. 29, 2004.

1. Technical Field

This invention relates to a D/A converter circuit, an organic EL drive circuit and an organic EL display device and, in particular, the present invention relates to a high precision D/A converter circuit, which utilizes current mirror circuits and is capable of being driven with low voltage and restricting an area taken by the D/A converter circuit when a plurality of D/A converters are formed as an IC. Further, the present invention relates to an organic EL drive circuit for driving column line (anode side drive line of organic EL elements) or data line by a drive current corresponding to display data, which are generated by the D/A converter circuit and outputted to terminal pins of an organic EL panel, while restricting luminance variation of display devices and luminance variation of individual display devices and easily performing gamma correction.

2. Background Art

An organic EL display panel of an organic EL display device mounted on a portable telephone set, a PHS, a DVD player or a PDA (portable terminal device) having 396 (132× 3) terminal pins of column line and 162 row line terminal pins has been proposed and the number of terminal pins of the column line and the number of terminal pins of row line tend to be further increased.

An example of a current drive circuit of such organic EL display panel, in which a D/A converter circuit is provided for each column pin, is disclosed in JP2003-234655A (Patent Reference 1) of the applicant of this application. In this example, the D/A converter circuits provided correspondingly to the column pins generate drive currents or a current on which the drive currents are generated in column direction by D/A-converting display data according to a reference drive current.

Patent Reference 1: JP2003-234655A

In order to reduce power consumption, power source voltages of output stage power sources of the D/A converter circuits except a last output stage power source are as low as about, for example, DC 3V and a voltage of the last output stage power source is DC 15 to 20V. The D/A converter circuit provided correspondingly to one of the column pins (or output terminals of a driver IC) generates a current, on which the drive current of an organic EL element (referred to as "OEL element", hereinafter) is generated by reference drive currents distributed to the column pin (or the output terminal of the driver IC) to drive the output stage current sources. Thus, the power consumption of the whole current drive circuit is restricted.

However, since the D/A converter circuits formed as an IC are provided correspondingly to the terminal pins, the D/A converter circuit is currently limited to 4 to 6 bits in order to restrict an area taken by the IC.

DISCLOSURE OF THE INVENTION

Problem to be Solved by the Invention

When each OEL elements is current-driven by driving the output stage current source by using the D/A converter circuit of 4 to 6 bits, there is a problem that the current conversion preciseness of the D/A converter circuit is not good and the drive current corresponding to the column pin or output terminal is varied. Therefore, variation of luminance of display devices or luminance variation of individual display devices may occur.

Incidentally, luminance of the OEL element of the organic EL display panel is not in linear relation to drive current generated correspondingly to display data as in the case of a cathode ray tube and shows characteristics curve depending on material of the elements for R, G or B. Therefore, image quality of the OEL elements is changed when environmental condition is changed and the change of image quality becomes conspicuous when resolution of the organic EL display panel becomes high. Therefore, gamma (γ) correction becomes necessary.

When gamma correction is performed, it may be usual that display data to be set in the D/A converter circuit is corrected by software. However, the D/A converter circuit of 4 to 6 bits makes the gamma correction impossible. In order to this problem, a gamma correction circuit is provided for each pin. In such resolution, there is a new problem that the area taken by the current drive circuit is increased.

The present invention is intended to solve the problem of the prior art and an object of the present invention is to provide D/A converter circuit capable of being driven with low voltage and restricting an area taken thereby when it is formed as an IC.

Another object of the present invention is to provide an organic EL drive circuit capable of or an organic EL Display Device capable of restricting variation or unevenness of luminance and making gamma correction easy and an organic EL display device using the organic EL drive circuit.

Means for Solving the Problem

In order to achieve the above object, a D/A converter circuit, which includes a first current mirror circuit having a plurality of output side transistors provided correspondingly to digits of data to be converted and generates an analog current by obtaining in at least one of the output side transistors a current corresponding to weight of digit of the data, comprises a second current mirror circuit connected on an upstream or downstream side of at least one of the output side transistors corresponding to lower digit of the data, wherein operating current ratio of the output side transistor of the second current mirror circuit to an input side transistor thereof is set to n:1 (where n is a positive integer) and the analog current is generated by obtaining a current corresponding to weight of digit, which is smaller than 1, on the output side transistor of the second current mirror circuit.

ADVANTAGE OF THE INVENTION

In the present invention, the analog current corresponding to digit having weight smaller than 1 is obtained by connecting the second current mirror circuit in series with the output side transistors of the first current mirror circuit between the power source line and the reference potential line (ground line). Therefore, in the present invention, it is possible to shift a digit of the output side transistor for generating an analog current corresponding to weight of the uppermost digit to a lower digit side. In this case, a value of current generated by one of the output side transistors of the first current mirror circuit, which corresponds to weight 1 or more, is reduced by a value corresponding to the shift to lower digit. However, the reduction of current can be recovered by increasing the drive current of the input side transistor. For example, when the digit is shifted to another digit by one, it is possible to obtain the analog current in the another digit by making the drive current of the input side transistor of the current mirror circuit twice.

Since the weights of the upper side digits starting from a digit having weight 1 are increased by powers of 2 with respect to immediately front digits, that is, 1, 2, 4, 8, 16, ..., the number of output side transistors is increased correspondingly. As to weights of digits smaller than 1, which are ½ (=0.5), ¼ (=0.25), ⅛ (=0.125), ..., that is, 1 divided by powers of 2, it is enough that the second current mirror circuit connected in series to the first current mirror circuit generate currents, which correspond to the currents divided by powers of 2. Therefore, the number of the output side transistors of the second current mirror circuit becomes smaller compared with the case of the maximum digit having weight increased by powers of 2, so that it is possible to reduce the number of transistors constituting the D/A converter circuits to thereby reduce the area of the IC taken by the D/A converter circuits.

Further, according to another aspect of the present invention, a bias circuit for equalizing voltages of the output electrodes such as sources or drains of the input transistor and the output transistors of the second current mirror circuit is provided. Therefore, it is possible to generate analog currents of the respective digits with high preciseness. Further, since the output side of the output side transistors of the first current mirror circuit corresponding to the digits having weights smaller than 1 are connected in series with the second current mirror circuit between the power source line and the reference potential line (ground line), the operating current (a sum of the currents flowing in the input side transistor and the output side transistors) of the second current mirror circuit flows. Thus, the current, which is larger than the current of the output side transistors of the second current mirror circuit for the digits having weight smaller than 1, flows in the output side transistors of the first current mirror circuit, so that it is possible to restrict the operating voltage of the output side transistors. Of course, large currents flow in the output side transistors corresponding to the digits having weights larger than 1. Thus, the low voltage driving of the D/A converter circuit becomes possible.

As a result, the D/A converter circuits capable of being driven with low voltage and of restricting the area taken by the D/A converter circuits when they are formed as an IC can be realized. Further, the current drive circuit for the column line or the data line, which generates drive currents corresponding to the display data by using the D/A converter circuit and outputs the drive current to the terminal pins of the organic EL display panel, can restrict the luminance or unevenness of the display device. Further, by increasing the number of bits of the D/A converter circuit to 8 bits or more, it is possible to perform gamma correction of the display data of respective output terminals easily to thereby realize the current drive circuit and to restrict the increase of the area taken by the current drive circuit.

BEST MODE FOR CARRYING OUT THE INVENTION

FIG. 1 is a block circuit diagram showing an organic EL drive circuit to which D/A converter circuits according to an embodiment of the present invention are applied, FIG. 2 is a block circuit diagram of another embodiment of the present invention and FIG. 3 is a block circuit diagram of an active matrix type organic EL drive circuit.

In FIG. 1, a reference numeral 10 depicts a column driver IC (refer to "column driver", hereinafter) as an organic EL drive circuit of an organic EL display panel, 11 a D/A converter circuit, 12 a constant voltage source for generating a reference drive current Ip, 13 a constant voltage bias circuit, 14 a peak current generator circuit, 15 a control circuit and 16 a register storing display data.

The D/A converter circuit 11 is constructed with a current mirror circuit including input side N channel MOS transistors TNa and TNp and output side N channel MOS transistors TNb to TNi. The input side transistor TNp is provided in parallel to the input side transistor TNa.

Drains of the output side transistors TNb to TNi correspond to digits of digits of a 8-bit display data, respectively, and generate a total of analog currents flowing to the drains. N channel MOSFETs Trb to Tri are provided as switch circuits, respectively, between sources of the output side transistors TNb to TNi and ground GND. Gates of the transistors Trb to Tri are connected to input terminals D0 to D7 of the display data, respectively. That is, the transistors Trb to Tri work as switch circuits and ON/OFF of the switch circuits are determined according to the display data from the register 16. The display data is set in the register 16 from an MPU, etc., according to a latch pulse LP of the control circuit 15.

Incidentally, back gates of the N channel input side transistors TNa, TNp, TNb to TNi, Trb to Tri are grounded.

The source of the input side transistor TNa is grounded directly and the source of the input side transistor TNp is grounded through a switch circuit SW. The gates of the transistors TNa, TNp and TNb to TNi are connected commonly and the gates and the drains of the transistors TNa and TNp are connected to an input terminal 11a of the D/A converter circuit 11. The transistors TNa and TNp are diode-connected and used as the input side transistors of the current mirror circuit.

Incidentally, the switch circuit SW is ON/OFF controlled by a control pulse CONT supplied from the control circuit 15 through an inverter 15a.

The display data D0 to D2 correspond to 3 digits having weights smaller than 1, that is, ⅛, ¼, ½, and the drains of the output side transistors TNb to TNd are connected to current mirror circuits 111, 112 and 113 provided on the upstream side, respectively. The output side transistors of the current mirror circuits 111, 112 and 113 are connected to an output terminal 11b of the D/A converter circuit 11 through an output line 114, respectively.

The display data D3 to D7 correspond to 4 digits having weights of 1 or larger. The drains of the output side transistors TNe to TNi corresponding to these 4 digits are connected to the output terminal 11b through the output line 114.

The output terminal 11b of the D/A converter circuit 11 is connected to an input of an output stage current source 1 and the D/A converter circuit 11 drives the output stage current source 1. The output stage current source 1 is usually constructed with a current mirror circuit. An input side transistor of this current mirror circuit is driven by the D/A converter circuit 11 and a current generated in output side transistor thereof is supplied to an anode of an OEL element 3 through a terminal pin 2 of the organic EL display panel. The OEL element is driven by the current. Incidentally, a cathode of the OEL element 3 is usually grounded through a row side drive circuit. Since the row side drive circuit does not relate to the present invention directly, it is shown here as grounded.

Signs ×1, ×2, ×4, ... on sides of the output side transistors TNa, TNp and TNb to TNi are cell numbers of transistors connected in parallel. In the case of ×1, there is no parallel connection. The output side transistors TNe to TNi generate analog currents corresponding to weights of the display data D3 to D7. The cell numbers of the output side transistors TNb to TNd are ×1, respectively, so that the operating currents flowing through them are equal.

Since the current mirror circuits 111, 112 and 113 are provided on the upstream side of the output side transistors TNb to TNd, the latter transistors generate analog currents having weights of ⅛, ¼ and ½, respectively.

That is, the output transistor TNe of the D/A converter circuit 11 corresponding to the fourth digit (D3), which corresponds to a center digit of the display data D0 to D7, has the weight 1. Therefore, the digits of the output transistors TNb to TNd, which correspond to the digits (D0 to D2), have weights, which are 1 divided by sequentially increasing powers of 2, and the digits of the output transistors TNb to TNd, which correspond to the digits (D4 to D7), have weights which are sequentially increasing powers of 2.

Incidentally, when the display data is 8 bits, the fourth digit (D3) corresponds to a digit, which corresponds to substantially a center when a digit having weight 1 is divided by 2 (for a case of m-bit display data, a digit of m/2 when m is an even number and the center digit when m is an odd number). Therefore, the digits having weights smaller than 1 are assigned to the output side transistors TNb to TNd corresponding to the digits D0 to D2 having weights smaller than that of the digit corresponding to substantially the center of the display data.

Therefore, it is possible to shift weight 128 of the uppermost digit by an amount corresponding to weights for 3 digits. The weight 128 of the uppermost digit of the 8-bit data is usually larger than twice of weight 64 of immediately before the uppermost digit. In this embodiment, however, one of currents divided by the current mirror circuit provided on the upstream side is used as a current of digits such as digits D0 to D2 having weights smaller than 1. That is, it is possible to restrict an increase of the number of the output side transistors of the current mirror circuit provided on the upstream side by generating currents having weights smaller than 1.

In this case, weights smaller than 1 can be easily realized by distributing the currents of the output transistors of the current mirror circuit provided on the downstream side to the transistors of the current mirror circuit provided on the upstream side with using channel width ratio (or gate width ratio) of the input side transistor and the output side transistors of the upstream side current mirror circuit. The currents having weights smaller than 1 distributed to the output side transistors of the upstream side current mirror circuit are outputted to the output terminal 11b of the D/A converter circuit 11.

For example, in a case where the uppermost digit side is shifted by 1 digit under conditions that the number of digits having weight smaller than 1 is only one, that the current is divided 1:1 by the input side transistor and the output side transistors of the upstream current mirror circuit and that the half of the current is outputted to the output terminal 11b of the D/A converter circuit from the digit having weight smaller than 1, the cell number of transistors of the uppermost digit becomes 64, which is reduced by 64. In this case, the increase of the transistor cell number having weight of ½ due to the current mirror circuit provided on the upstream side in this embodiment is only 4 totally including increased 2 transistors in the current mirror circuit and 2 transistors in the constant voltage bias circuit 13, which are increased.

The current mirror circuit 111 provided on the upstream side of the output side transistor TNb corresponding to D0 is constructed with an N channel input side transistor QN1 and an N channel output side transistor QN2. A drain of the transistor QN1 is connected to a power source line +VDD through a transistor TN1 and a drain of the transistor QN2 is connected to the output terminal 11b through a transistor TN2 and the output line 114. Sources of the transistors QN1 and QN2 are connected to the drain of the output side transistor TNb.

The current mirror circuit 112 provided on the upstream side of the output side transistor TNc corresponding to D1 is constructed with an N channel input side transistor QN3 and an N channel output side transistor QN4. A drain of the transistor QN3 is connected to the power source line +VDD through a transistor TN3 and a drain of the transistor QN4 is connected to the output terminal 11b through a transistor TN4 and the output line 114. Sources of the transistors QN3 and QN4 are connected to the drain of the output side transistor TNb.

The current mirror circuit 113 provided on the upstream side of the output side transistor TNd corresponding to D2 is constructed with an N channel input side transistor QN5 and an N channel output side transistor QN6. A drain of the transistor QN5 is connected to the power source line +VDD through a transistor TN5 and a drain of the transistor QN6 is connected to the output terminal 11b through a transistor TN6 and the output line 114. Sources of the transistors QN5 and QN6 are connected to the drain of the output side transistor TNb.

Incidentally, gates of the transistors QN1 to QN6 are connected to the power source line +VDD.

The constant voltage bias circuit 13 is constructed with a constant voltage circuit 13a and the N channel transistors TN1 to TN6.

Gates of the transistors TN1 to TN6 are connected to a line 115 through the constant voltage circuit 13a having voltage Va. Therefore, voltages of the drains of the transistors QN1 to QN6 connected to the downstream side of the transistors TN1 to TN6 become Va-Vgs and become substantially equal. Incidentally, Vgs is a gate-source voltage of each of the transistors QN1 to QN6, which is in the order of 0.7V. The gate voltages of the transistors QN1 to QN6 are the same.

As a result, it is possible to make the drain-source currents of the transistors constructing the current mirror circuits 111 to 113 equal with units of transistor cell to thereby improve the current conversion accuracy.

Ratio of the number of transistor cells of the transistor QN1 connected in parallel and the number of transistor cells of the transistor QN2 connected in parallel is 7:1. Therefore, the ratio of channel width (gate width) of these transistors is set to 7:1. As a result, a current, which is one eighth of the current flowing in the output side transistor TNb is sunk from the output line 114.

The ratio of channel width of these transistors determines the ratio of operating currents of the input side transistor QN1 and the output side transistor QN2 of the current mirror circuit 111.

Similarly, ratio of the number of transistor cells of the transistor QN3 connected in parallel and the number of transistor cells of the transistor QN4 connected in parallel is 3:1. Therefore, one fourth of the current flowing in the downstream side output transistor TNc is sunk from the output line 114.

Further, ratio of the number of cells of the transistor QN5 connected in parallel and the number of transistor cells of the transistor QN6 is 1:1. Therefore, a half of the current flowing in the downstream side output transistor TNd is sunk from the output line 114.

As described, the weights of the current sunk from the output terminal 11b become ⅛, ¼ and ½, which are generated in the respective digits having weights smaller than 1. In this case, the current flowing in the downstream transistors TNb to TNd is the sum of the currents distributed by the current mirror circuits 111 to 113, that is, the total current of the current mirror circuits, and is equal to the current flowing in the transistor TNe of the fourth digit (D3). Therefore, the voltage between the drains-sources of the transistors TNb to TNd can be made lower than that in the usual case where the current of the digit having weight smaller than 1 is directly obtained. Further, since the voltage has a value corresponding to the drive currents flowing in the transistors TNa and TNp, the preciseness is high.

As such, since the currents flowing in the transistors TNb to TNe are substantially equal, the preciseness of current in the digits from the fourth digit (D3), which have weights smaller than 1, is improved. Further, since the number of parallel connected cells of the uppermost digit is as small as 16, the preciseness of the converted current is improved.

Ratio of the number of cells of the input side transistor TNa connected in parallel and the number of cells of the transistor TNp connected parallel is 1:9. Therefore, the ratio of channel width (gate width) of these transistors is set to 1:9.

Incidentally, the size of the D/A converter circuit 11 is reduced correspondingly to the shift of the current value generated in the output side transistor to the lower digit. However, it is possible to obtain the analog current in the digit before the shift, in the shifted lower digit. The constant voltage source 12 generates the drive current of the input side transistor.

The constant voltage source 12 is connected to the power source line +VDD, which is as low as, for example, +3V and supplies the drive current Ip to the transistors TNa and TNb provided downstream side through the input terminal 11a.

The constant current source 12 corresponds to the output current source of the reference current distribution circuit. The reference current distribution circuit includes a current mirror circuit and the reference current is supplied to an input side transistor of the current mirror circuit and a plurality of output side transistors of the current mirror circuit, which are provided in parallel correspondingly to the output terminal pins, generate the reference currents as the mirror currents. The distributed reference currents or the reference drive currents obtained by amplifying the reference currents generate peak currents in the drive current in an initial drive period of the OEL element 3. The current corresponding to the current by which the peak current is generated is the drive current Ip. The drive current Ip is outputted from the output side transistors of the current mirror circuit provided in the reference current distribution circuit to the respective D/A converter circuits 11. Therefore, the current source 12 is constructed usually with a single P channel MOS transistor having a source connected to the power source line +VDD and a drain connected to the input terminal 11a.

As shown in FIG. 1, the switch circuit SW on the downstream side of the transistor TNp receives a signal obtained by inverting a control pulse CONT by an inverter 15a. The control circuit 15 generates the control pulse CONT, which becomes HIGH level ("H") for a constant period in the initial drive period of the OEL element 3. Thus, the switch circuit SW becomes OFF in the initial drive period and the analog current for generating the peak current is generated in the D/A converter circuit 11. Thereafter, the control pulse CONT becomes LOW level ("L") so that the switch circuit SW is turned ON by the inverted signal "H". Therefore, the drive current Ip flows to the transistors TNa and TNp as Ip/10 and the drive current of the OEL element 3 is reduced from the peak current in the initial drive period to the steady-state current.

Therefore, notwithstanding that weights of the currents sunk from the output terminal 11b by the output side transistors TNb to TNd of the current mirror circuit are ⅛, ¼ and ½, the D/A converter circuit 11 shown in FIG. 1 can make these operating currents substantially equal to the current of the output transistor TNe, which is the fourth digit (D3) having weight 1. Further, notwithstanding that the number of conversion bits is 8, the maximum weight is ×16. Therefore, it is possible to restrict variation of the output currents of the higher digits than the fourth digit (D3).

FIG. 2 shows a D/A converter circuit 110 according to another embodiment of the present invention, which includes a voltage follower (buffer amplifier) 130 instead of the constant voltage bias circuit 13.

The drive currents of the input side transistors QN1, QN3 and QN5 of the current mirror circuits 111m 112 and 113 are supplied through not the power source line +VDD but the voltage follower 130. Since the transistors TN1 to TN6 are deleted, the number of transistors is further reduced The voltage follower 130 is constructed with a differential amplifier (for example, an operational amplifier) having a (+) input terminal connected to the output line 114 and a (−) input terminal connected to an output terminal of the differential amplifier. The output terminal is connected to the drains of the transistors QN1, QN3 and QN5 through the line 115.

Since other portions of this embodiment are the same as those shown in FIG. 1, the explanation thereof is omitted.

In this embodiment, these output voltages are set equal to the voltage of the output terminal 11b by the voltage follower 130, so that the drain voltages of the transistors QN1 to QN6 are equal to the voltage of the output terminal 11b.

As a result, the drain voltages of the input side transistors and the output side transistors of the current mirror circuits 111 to 113 and the gate voltages thereof are equal to the voltage of the power source line +VDD. Therefore, the bias voltages of these current mirror circuits are the same, so that the operating current error is reduced and the preciseness of current conversion is improved.

The merit of the D/A converter circuit 110 is to improve the preciseness of current conversion when the output stage current source 1 is provided in the output terminal 11a of the D/A converter circuit shown in FIG. 1 as in the passive matrix type organic EL panel.

That is, though the potential of the output line 114 is varied by several volts according to the output current of the output terminal 11a when the output stage current source 1 operating with the power source voltage, which is, for example, 15 to 20V, higher than the power source line +VDD (for example, 3V) is driven, it is possible to restricts the variation of voltage to a range from several mV to several tens mV in this embodiment.

In the embodiment shown in FIG. 1, ratio of the number of cells of the transistor QN3 connected in parallel and the number of cells of the transistor QN4 is 3:1 and ratio of the number of cells of the transistor QN5 and the number of cells of the transistor QN6 is 1:1. In this embodiment, however, operating current ratio of the transistors QN3 and QN4 is 3:1 and cell number ratio thereof is 6:2 and ratio of operating currents of the transistors QN5 and QN6 is 1:1 and cell number ratio thereof is 4:4. Therefore, it is possible that the operating currents flowing in all of the transistor cell circuits are made Ip/8, where Ip is the drive current value when the peak current of the input side transistor cell circuit is generated. The drive current in steady-state is Ip/10.

Therefore, in this embodiment, it is possible to make the potential of the drains of the output side transistors TNb to TNe substantially equal. As a result, it is possible to further improve the preciseness of output currents (analog conversion currents) of the output side transistors TNb to TNe.

FIG. 3 is a block circuit diagram showing a concrete example of an active matrix type organic EL panel. Since the output terminal 11a of the D/A converter circuit 110 (or D/A converter 11) is the current sink output, the output stage current source 1 is deleted and the output terminal 11a of the D/A converter circuit is directly connected to terminal pins 2 in FIG. 3. In this embodiment, the output terminal 11a is connected to a data line X (X1 to Xn) of a pixel circuit 4 of an active matrix type organic EL panel 101 through the terminal pin 2 to drive the organic EL panel.

A current drive circuit 100 has the D/A converters 110 provided correspondingly to the respective output terminal pins 2 and is controlled by the MPU 6. The control circuit 15 sends timing control signals T1 and T2 to a write control circuit 5 under control of the MPU 6.

As shown in FIG. 3, the pixel circuit 4 is provided in each of cross points of X and Y matrix wirings (data lines X1, . . . , Xn and scan lines Y1, Y2, . . . ) and includes an N channel MOS transistor Tr1 provided in each of the cross points and having a gate connected to the scan line (Y1) and a source connected to the data line (X1). The OEL element 4a is driven by a P channel MOS transistor Tr2 provided in the pixel circuit 4. A capacitor C is connected between a source and a gate of the transistor Tr2. The source of the transistor Tr2 is connected to a power source line +Vcc of, for example, +7V and a drain thereof is connected to an anode of the OEL element 4a. A cathode of the OEL element 4a is connected to a switch circuit 7a of a row side scan circuit 7 and is grounded through the switch circuit 7a.

In the pixel circuit 4, a P channel MOS transistor Tr3 and an N channel MOS transistor Tr4 are provided between the transistors Tr1 and Tr2. The transistor Tr3 is an input side transistor of a current mirror circuit 4b and the transistor Tr4 is an output side transistor of the current mirror circuit 4b. The drain of the transistor Tr1 is connected to these transistors. The transistor Tr4 is connected between a connecting point of the transistors Tr3 and Tr1 and a common gate (gate of the transistor Tr2) of the current mirror circuit 4b.

The gate of the transistor Tr1 is connected to the write control circuit 5 through the scan line Y1 (write line) and the gate of the transistor Tr4 is connected to the write control circuit 5 through a scan line Y2 (erase line). The write control circuit 5 scans the scan line Y1 (write line) and the scan line Y2 (erase line) according to the control signals T1 and T2 and, when these scan lines become "H", the transistors Tr1 and Tr4 are turned ON. Therefore, the transistor Tr2 is driven by a predetermined drive current and the capacitor C is charged thereby to hold a predetermined drive voltage. As a result, the drive current value is written in the capacitor C. In this case, the capacitor C stores the drive current as a voltage value. Incidentally, according to the control pulse CONT from the control circuit 15, the peak current flows to the capacitor C in the initial charging period.

The MOS transistor Tr2 is driven by the voltage stored in the capacitor C. In this case, the voltage stored in the capacitor C becomes a voltage value corresponding to the write drive current and the OEL element 4a is driven by current value corresponding to the write drive current. When the channel widths of the transistors Tr2 and Tr3 are equal, it is possible to generate a drive current equal to the write current.

In each of the described embodiments, the current mirror circuits 111 to 113 are provided on the upstream side of the output side transistors TNb to TNd of the current mirror circuit constructing the D/A converter and connected thereto between the power source line and the ground line (reference potential line). However, these transistors may be provided on the downstream side of the output side transistors TNb to TNd of the current mirror circuit.

INDUSTRIAL APPLICABILITY

Though, in the described embodiments, the D/A converter circuit having N channel MOS transistors mainly, it is of course possible to construct the D/A converter circuit with P channel MOS transistors or a combination of N channel MOS transistors and P channel MOS transistors. Further, these transistors may be bipolar transistors. In the latter case, a base, an emitter and a collector of the bipolar transistor correspond to the gate, the source and the drain of the MOS transistor, respectively, and emitter area ratio corresponds to the channel width (gate width) ratio of the MOS transistor.

DESCRIPTION OF REFERENCE NUMERALS AND SIGNS

Figure 1:
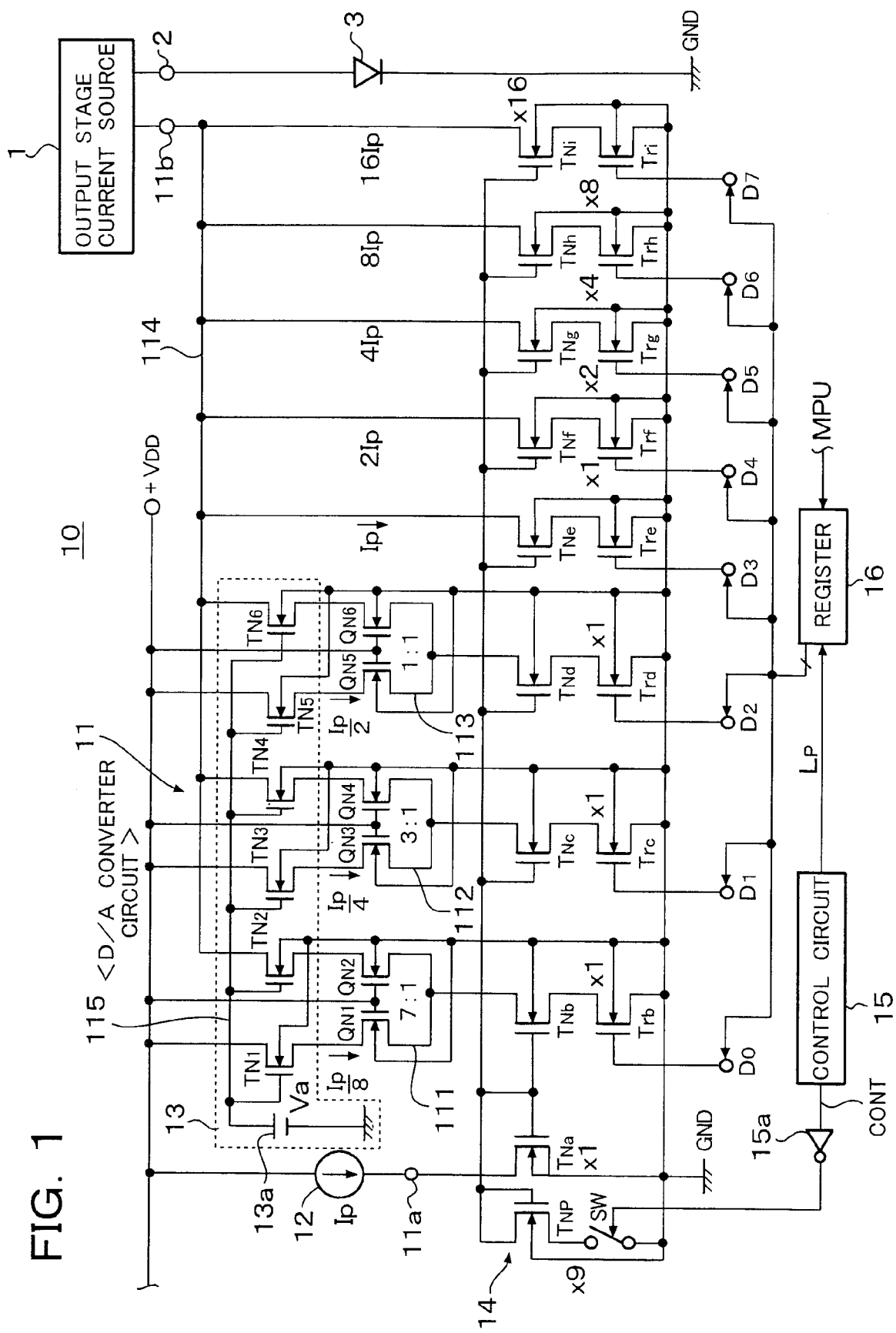
FIG. 1 is a block circuit diagram of an embodiment of an organic EL display panel to which a D/A converter circuit according to the present invention is applied.
Figure 2:
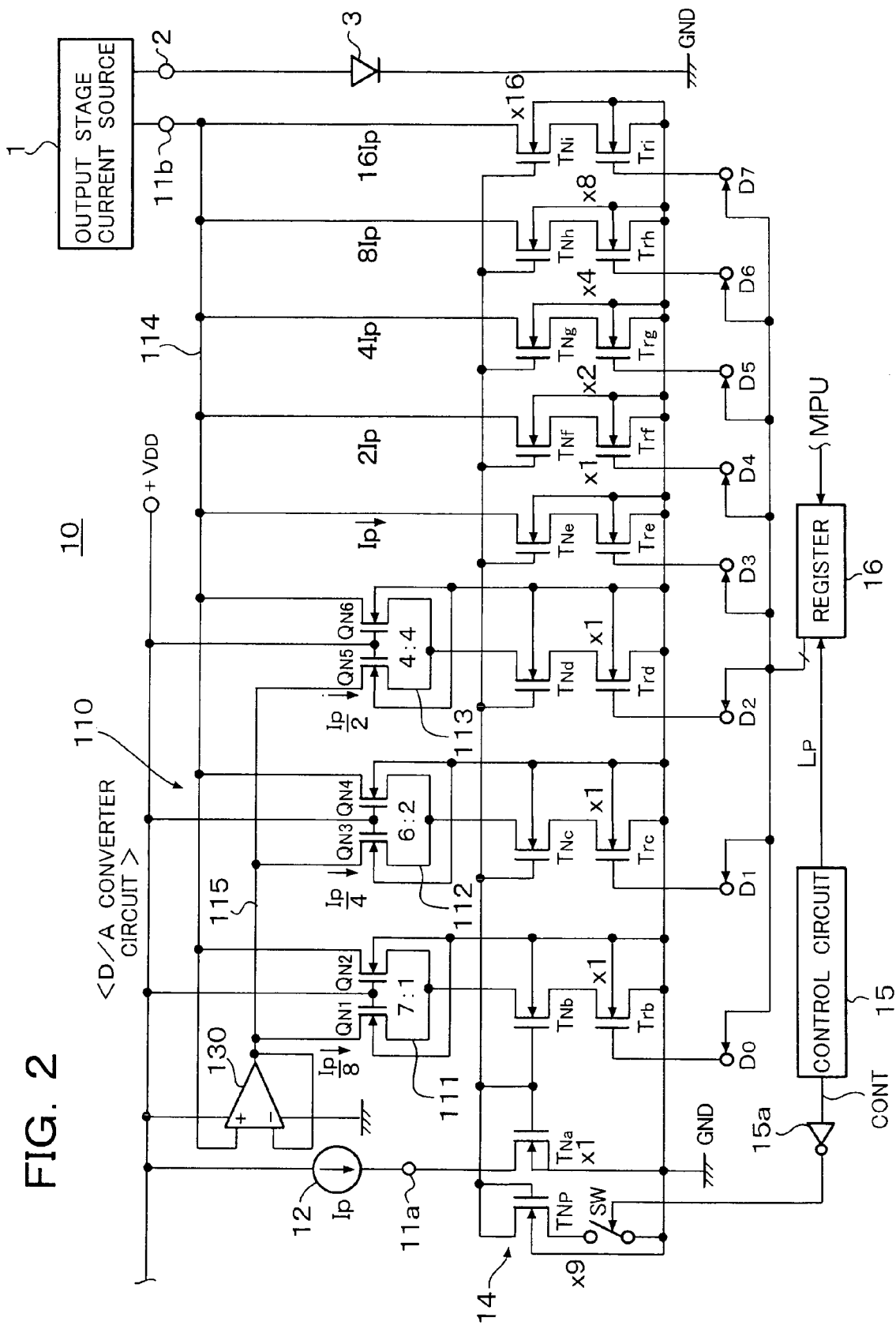
FIG. 2 is a block circuit diagram of another embodiment.
Figure 3:
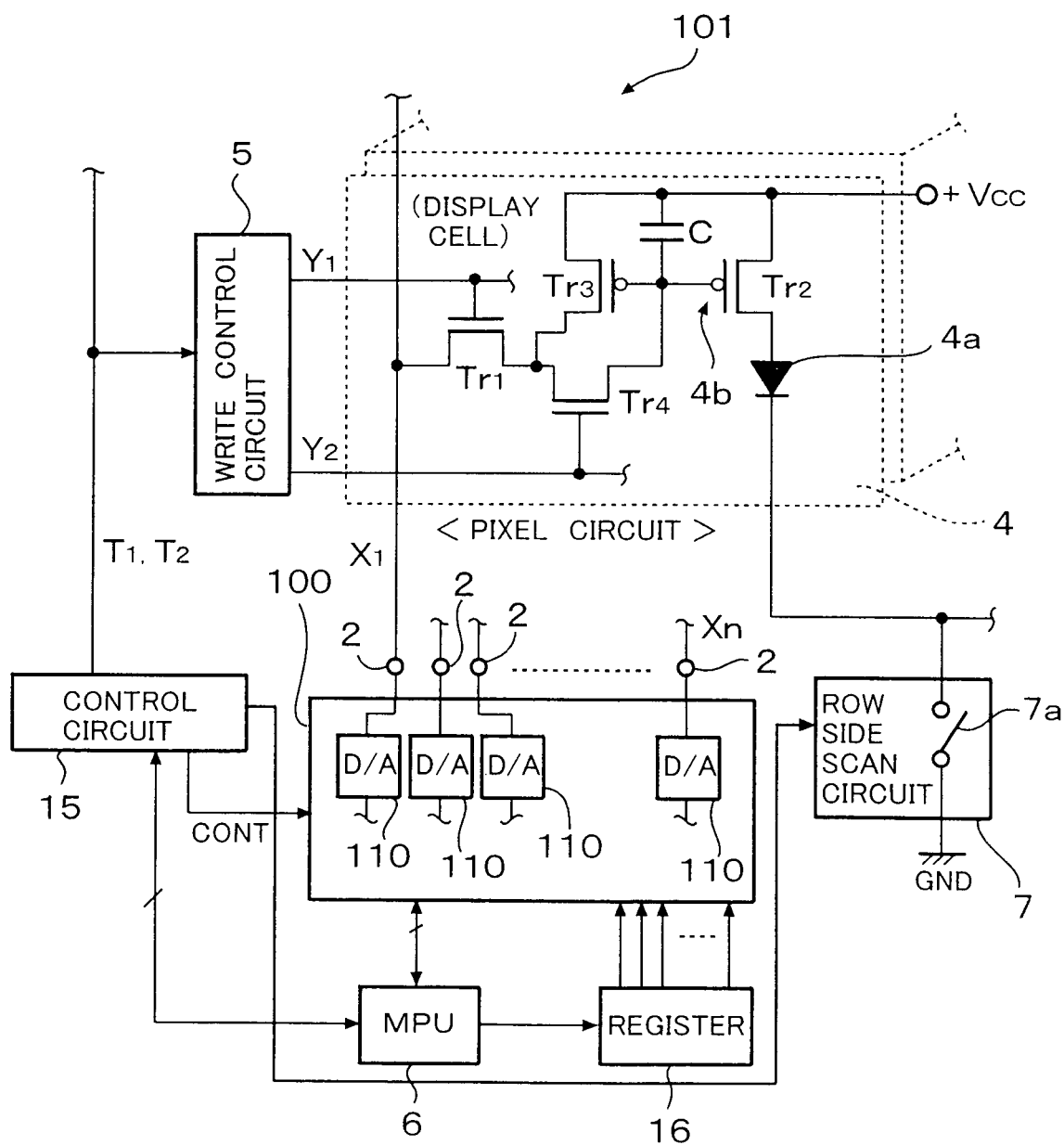
FIG. 3 is a block circuit diagram of an active matrix type organic EL drive circuit.

1 . . . output stage current source
2 . . . terminal pin
3, 4a . . . OEL element
5 . . . write control circuit
6 . . . MPU
7 . . . row side scan circuit
10 . . . column driver
11 . . . D/A converter circuit
12 . . . constant current source
13 . . . constant voltage bias circuit
13a . . . constant voltage circuit
14 . . . peak current generator circuit
15 . . . control circuit
15a . . . inverter
16 . . . register
111 to 113 . . . current mirror circuit
130 . . . voltage follower
TNa to TNi, QN1 to QN6, TN2 to TN6 . . . N channel MOS transistor

The invention claimed is:

1. A D/A converter circuit, which includes a first current mirror circuit having a plurality of output side transistors provided correspondingly to digits of data to be converted and generates an analog current by obtaining in at least one of the output side transistors a current corresponding to weight of a digit of the data, comprising:

a second current mirror circuit connected on an upstream or downstream side of at least one of the output side transistors corresponding to a lower digit of the data, wherein an operating current ratio of the output side transistor of the second current mirror circuit with respect to an input side transistor thereof is set to n:1 (where n is a positive integer) and the analog current is generated by obtaining a current corresponding to a weight of the lower digit, which is less than 1, on the output side transistor of the second current mirror circuit.

2. A D/A converter circuit as claimed in claim 1, wherein the current corresponding to the weight of the lower digit which is less than 1 is outputted to an output terminal of the D/A converter circuit as corresponding to at least one of the lower digits of the data to be converted.

3. A D/A converter circuit as claimed in claim 2, further comprising a constant bias circuit, wherein voltages of the output electrodes of the input side transistor and the output side transistors of the second current mirror circuit are set to a predetermined constant voltage by the constant voltage bias circuit.

4. A D/A converter circuit as claimed in claim 3, wherein the constant voltage bias circuit includes a constant voltage circuit and a plurality of transistors which are connected in series with the input side transistor and the output side transistors of the second current mirror circuit, respectively, the voltage the output electrodes are set to the constant voltage by setting gates or bases of the plurality of the transistors in series with the input and output side transistors to a predetermined constant voltage by the constant voltage circuit.

5. A D/A converter circuit as claimed in claim 4, wherein the data to be converted is m-bit data, m/2 is used as the digit having a weight of 1 when m is an even number, a center digit is used as the digit having a weight of 1 when m is an odd number, the second current mirror circuit is provided for each of the digits having weights less than 1 and n is selected correspondingly to the digit having weights less than 1, respectively.

6. A D/A converter circuit as claimed in claim 3, wherein the input side transistor and the output side transistors of the second current mirror circuit and the plurality of the transistors connected in series with the input and output side transistors are MOS transistors, respectively, and values of the currents, which are obtained by dividing the operating currents of the second current mirror circuit by powers of 2, are distributed to the output side transistors of the second current mirror circuit and outputted to the output terminals, respectively.

7. A D/A converter circuit as claimed in claim 3, wherein the input side transistor and the output side transistors of the second current mirror circuit and the plurality of the transistors connected in series with the input and output side transistors are MOS transistors, respectively, and the constant voltage bias circuit includes a voltage follower for connecting the output electrode of the output side transistor of the second current mirror circuit to the output electrodes of the input side transistor.

8. A D/A converter circuit as claimed in claim 6, wherein the data to be converted is 8 bits or more.

9. A D/A converter circuit as claimed in claim 6, wherein the data to be converted is a gamma corrected display data of 8 bits or more.

10. An organic EL drive circuit wherein the data to be converted in claim 1 is a display data and an organic EL element is driven by an output current of a D/A converter circuit.

11. An organic EL drive circuit comprising a D/A converter circuit as claimed in claim 1 and a current source driven by an output current of the D/A converter circuit, for driving an organic EL element, where the data to be converted.

12. An organic EL display device comprising an organic EL drive circuit claimed in claim 10.

\* \* \* \* \*